United States Patent [19]

Pengelly

[11] Patent Number: 4,901,041
[45] Date of Patent: Feb. 13, 1990

[54] HIGH-PERFORMANCE PACKAGE FOR MONOLITHIC MICROWAVE INTEGRATED CIRCUITS

[75] Inventor: Raymond S. Pengelly, Lawrenceville, N.J.

[73] Assignee: Grumman Corporation, Bethpage, N.Y.

[21] Appl. No.: 251,446

[22] Filed: Sep. 30, 1988

[51] Int. Cl.$^4$ ............................................. H01P 5/00
[52] U.S. Cl. ................................... 333/33; 333/204; 333/246; 357/74; 357/80
[58] Field of Search .................. 333/33, 204, 238, 246, 333/247; 357/74, 80; 361/401; 174/52.4

[56] References Cited

U.S. PATENT DOCUMENTS

| 4,172,261 | 10/1979 | Tsuzuki et al. | 333/247 X |
| 4,259,684 | 3/1981 | Dean et al. | 357/80 X |
| 4,453,142 | 6/1984 | Murphy | 333/33 X |
| 4,626,805 | 12/1986 | Jones | 333/33 |

OTHER PUBLICATIONS

Bettner et al, A Low Cost "Monolithic-Monolithic" Gain Module, Microwave Journal, Dec. 1987, pp. 109, 110, 112 & 113.

Primary Examiner—Paul Gensler
Attorney, Agent, or Firm—Bacon & Thomas

[57] ABSTRACT

The present invention incorporates a specially-designed low-pass filter into the feedthrough of a monolithic microwave integrated circuit (MMIC) to provide compensation for discrepancies from the impedance required for an MMIC package to be matched to a transmission line. The compensation allows all parameters to be adjusted and the complete filter to be printed.

The main features of the invention include minimum width for the under-wall conductor and brazing metallization, two open-circuited stubs at the package-die interface for wire bonding ease, and metal-filled vias connecting the ground plane base and the lid sealing ring to bring the lid sealing ring to RF ground.

The present ivention also includes a method for designing the desired feedthrough that obviates the need for scale-model feedthrough design before printing, a prior art method that requires precision in the scale model. An electrical model of a feedthrough is first derived. The electrical model is then adjsuted according to the parameters desired for a new, compensated feedthrough using any known method, including software such as Touchstone. Finally, the new feedthrough is fabricated based upon the adjusted electrical model.

6 Claims, 2 Drawing Sheets

HIGH-PERFORMANCE PACKAGE FOR MONOLITHIC MICROWAVE INTEGRATED CIRCUITS

BACKGROUND OF THE INVENTION

1. Field of the Invention

The present invention relates generally to packaging for integrated circuits, and, more specifically, to high-performance packaging for monolithic microwave integrated circuits (MMICs) operable at frequencies in the 20 GHz range.

2. Description of the Related Art

Packaging techniques known to the prior art have been well documented. Known manufacturing techniques include cofired ceramic enclosures using thick-film metallization, glass-sealed ceramic enclosures using thin-film metallization, metal enclosures having ceramic feedthroughs, and metal enclosures having glass feedthroughs.

Since ceramic-package manufacture is a batch process, it has a distinct advantage over some of the other technologies available. If the yield of the process is high, ceramic packages should be low cost in reasonable volume.

Of the few cofired ceramic packages generally available for MMICs and power FETs, the main contributor to poor microwave performance is the lead feedthrough. In typical state-of-the-art designs, discontinuities exist due to the lead attachment, to passage of the conductor into and out from the ceramic wall, to changes in the conductor width, and to coupling of F signals to the lid and lid sealing ring. These discontinuities introduce higher-order modes and reflections as a result of impedance mismatch, and contribute to overall poor feedthrough performance, especially at frequencies above 10 GHz.

An MMIC package capable of good performance in the 20 GHz range should have low insertion loss and voltage standing wave ratio (VSWR) per lead feedthrough, good isolation between leads, microstrip compatibility, and an electrical design approach extendable to higher frequencies. The present invention fulfills all of these goals in a package that is cascadable, bondable, and capable of extensive application throughout the entire MMIC industry, including military applications.

SUMMARY OF THE INVENTION

The present invention incorporates a specially-designed low-pass filter into the feedthrough itself to provide compensation for discrepancies from the impedance required for an MMIC package to be matched to a transmission line (typically 50 Ohms). The compensation used is similar to LC techniques known to the prior art, but allows all parameters to be adjusted and the complete filter to be printed.

The main features of the present compensated feedthrough include minimum width for the under-wall conductor and brazing metallization, two open-circuited stubs at the package-die interface for wire bonding ease, and metal-filled vias connecting the ground plane base and the lid sealing ring to bring the lid sealing ring to RF ground.

The present invention also includes a method for designing the desired feedthrough that obviates the need for scale-model feedthrough design before printing, a prior art method that requires precision in the scale model. An electrical model of a feedthrough is first derived. The electrical model is then adjusted according to the parameters desired for a new, compensated feedthrough using any known method, including software such as Touchstone. Finally, the new feedthrough is fabricated based upon the adjusted electrical model.

DETAILED DESCRIPTION OF THE PREFERRED EMBODIMENTS

Figure 1:
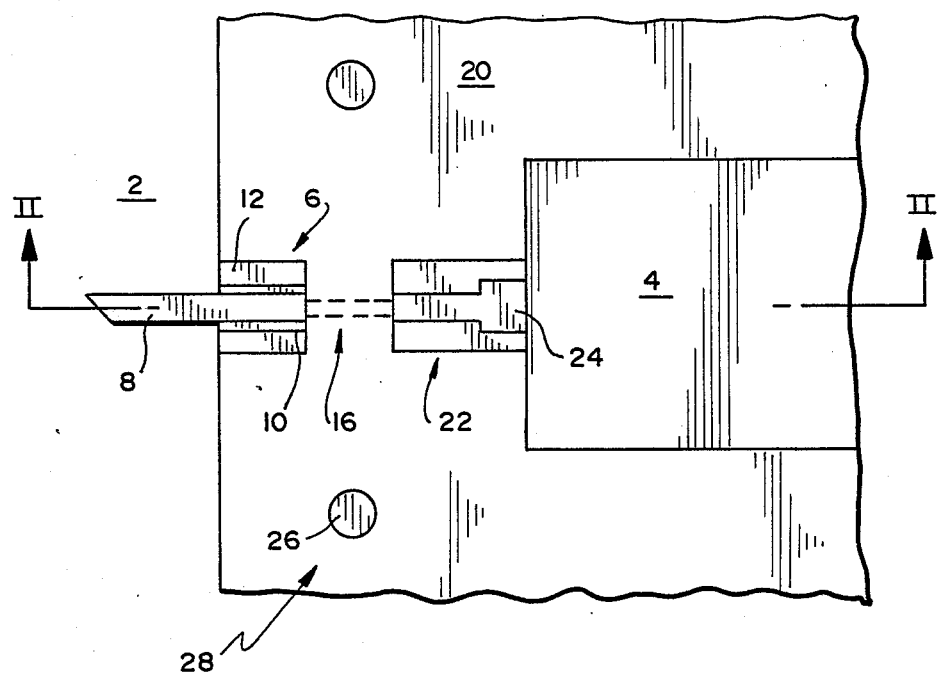
FIG. 1 is a plan view of a compensated feedthrough fabricated in accordance with the teachings of the present invention.

FIG. 1 is a plan view of a preferred embodiment of the compensated feedthrough constructed in accordance with the present invention. The main features of the feedthrough include the conductor under-wall width, which is reduced to the minimum that can be printed reproducibly in thick-film technology (currently about 6 mil); the brazing-metallization width, which is likewise reduced to the minimum allowable; two open-circuited stubs set immediately prior to the interface between the feedthrough and the die; and a plurality of metal-filled vias formed in the ceramic to connect the ground plane base to the lid sealing ring.

As shown, the feedthrough conducts a signal between the exterior of an electronics package (designated generally by reference numeral 2) and an integrated circuit chip located in die cavity 4. The integrated circuit chip in this preferred embodiment is a monolithic microwave integrated circuit (MMIC) that operates at frequencies as high as 20 GHz, although the invention could conceivably be applied to electronic circuit packages that utilize other known integrated circuits.

Figure 2:
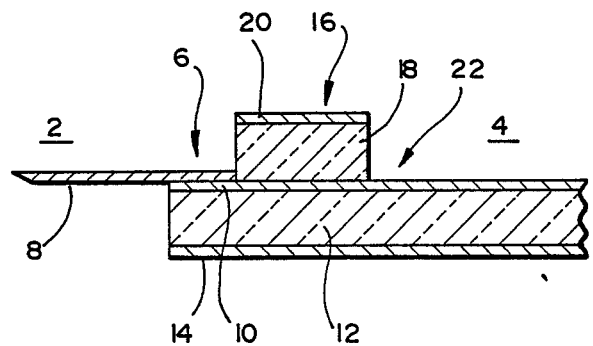
FIG. 2 is a cross section taken along the line II—II of the feedthrough shown in FIG. 1.

The present compensated feedthrough includes first microstrip transmission line section 6, transmission line section 16, and second microstrip transmission line section 22. Depending upon the exact design and environment for the package, microstrip section 6 may connect to an external transmission line (e.g., coaxial) via pin lead 8 as shown, or, alternatively, via any input known to the art, including a surface mount input. With reference also to FIG. 2 (a cross section of FIG. 1 looking in the direction of arrows II—II), microstrip section 6 includes metallization 10 forming a signal conductor on dielectric layer 12 using known techniques. Ground plane base 14, which is preferably a copper-tungsten alloy, provides an RF ground for the package.

Transmission line section 16 comprises metallization 10 forming a signal conductor plated between dielectric layers 12 and 18, ground plane base 14, and upper sealing ring 20, which is formed over second dielectric layer 18 using known techniques. As shown in FIG. 1, metallization 10 is narrowed, or "necked down", when it passes below second dielectric layer 18 ("under-wall"). Section 16, which resembles stripline or RI-PLATE TM, is nevertheless not pure stripline since lid sealing ring 20 is not a true RF ground. Therefore, section 16 may be referred to as a pseudostrip section of transmission line, and analyzed accordingly.

Second microstrip transmission line section 22, which is similar to microstrip section 6, terminates in bond pad 24, formed substantially square, of metallization layer 10 just before die cavity 4. Bond pad 24 is well known in the art as effecting two open-circuited stubs, which are modeled as a shunt capacitance. Bond pad 24 also enhances wire bonding to the MMIC.

Figure 3:
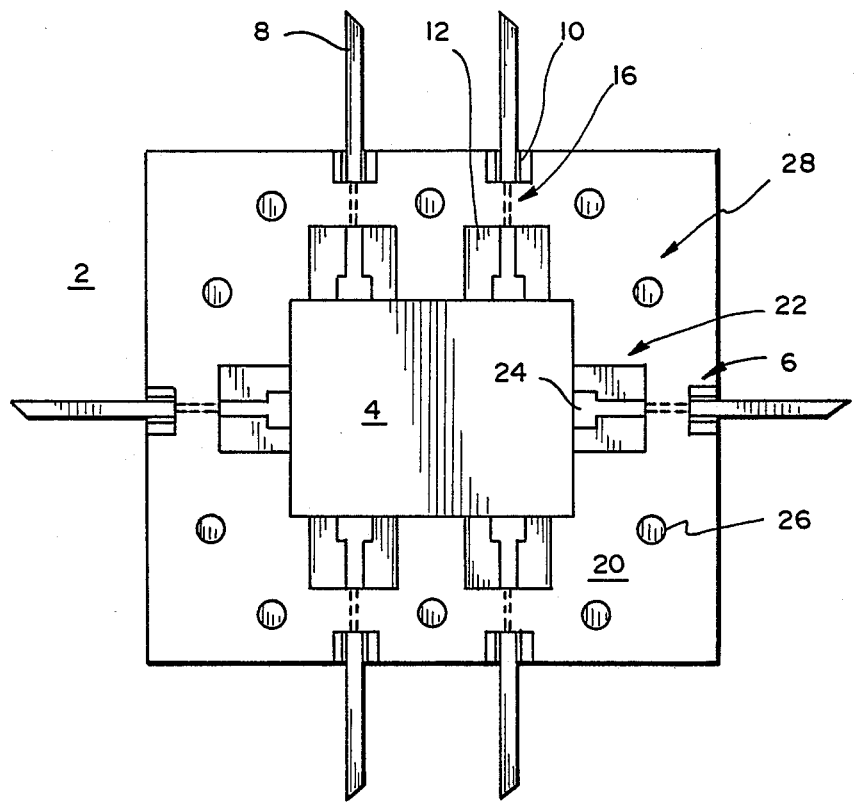
FIG. 3 is a plan view of an integrated circuit package fabricated in accordance with the teachings of the present invention.

In order to improve the stripline transmissive characteristics of pseudostrip section 16 and the package as a whole, a plurality of apertures, or vias, 26 are formed in the package. Vias 26 extend from ground plane base 14 up through the dielectric material to lid sealing ring 20, and are filled with metal to bring lid sealing ring 20 substantially to RF ground. When vias 26 are spaced between the various feedthroughs as shown in FIG. 3, they represent an improvement over prior art packages, which rely solely upon metallization of the internal walls of the package to reference the lid sealing ring. While internal wall metallization is preferably retained in the present IC package, vias 26 both improve the status of lid sealing ring 20 as RF ground and greatly improve isolation between leads, which could not be accomplished simply by metallizing the internal walls.

FIG. 3 illustrates a representative package incorporating six feedthroughs having the compensation described with respect to FIG. 1, with like reference numerals designating like elements. As shown in FIG. 3, vias 26 are preferably spaced approximately equidistantly between the various feedthroughs that are located in the waveguide portion 28 of the package. As many or as few vias as are desired may be provided in the package up to the limits of manufacturing technology. The more vias, the better the isolation.

The feedthrough design described above is based on a low-pass filter consisting of the lead-attachment area, the microstrip-pseudostrip-microstrip transmission line, and the dual open-circuited stubs. Although low-pass filters have been used in the prior art to provide compensation at the feedthrough, the present invention allows, within manufacturability limits, all parameters to be adjusted, and the complete filter to be printed.

These objectives are accomplished by utilizing a modeling technique to design an appropriate feedthrough. One way to establish a desired electrical model is to begin with an existing feedthrough, from which a temporary equivalent electrical circuit may be determined. The equivalent circuit is temporary in that its specific component values are adjustable depending upon the electrical characteristics desired for the compensated feedthrough. Once the temporary equivalent circuit is established for the existing feedthrough, the values for the temporary equivalent circuit are adjusted to achieve desired electrical characteristics. Working backward, the equivalent circuit that achieves these desired electrical characteristics becomes the basis for physical manifestation in a new feedthrough design.

The basic structure of the feedthrough described above is well known in the art. For example, lead attachments are known, microstrip transmission lines are known, stripline transmission lines are known, and the structures used to create all of the above are known. Fabricating the known elements, however, in the manner shown above, and to create the structure shown above, is not known to the prior art.

Figure 4:
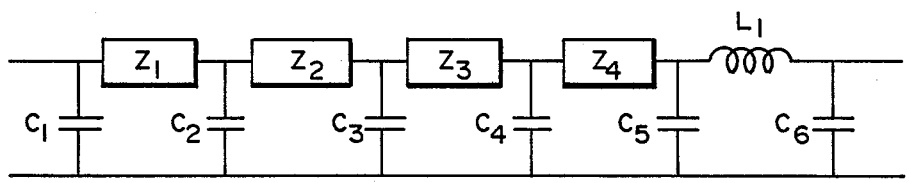
FIG. 4 is an equivalent circuit for feedthrough of the type shown in FIG. 2.

Referring to FIG. 4, the equivalent electrical circuit of a feedthrough similar to the subject feedthrough package is shown. This same equivalent circuit applies to any such feedthrough, including both the existing and desired feedthroughs mentioned above. Moving from left to right (with respect to both FIGS. 2 and 4):

$C_1$ = discontinuity capacitance at the interface between lead 8 and metallization 10;

$C_2$ = discontinuity capacitance created where metallization 10 enters the package wall 18;

$C_3$ = discontinuity capacitance where the width of metallization 10 narrows under the package wall 18;

$C_4$ = discontinuity capacitance as narrow line metallization 10 leaves the package wall 18;

$C_5$ = end-effect discontinuity capacitance created at the microstrip-bond pad 24 interface;

$C_6$ = bond pad 24 capacitance;

$Z_1$ = impedance of the lead 8 attachment area;

$Z_2$ = impedance of the wide line section of metallization 10 under wall 18;

$Z_3$ = impedance of the narrow-line metallization 10 under wall 18;

$Z_4$ = impedance of the bond pad 24; and $L_1$ = combination of end-effect inductance and wire bond inductance.

$Z_2$ and $Z_3$, while shown as block impedances, are more accurately characterized by dividing them into 10 inductor/capacitor networks, since the pseudostripline cannot be treated as pure stripline, as mentioned above.

A preferred method of fabricating a desired feedthrough is to adjust the component values of the equivalent circuit using a software package, for example TOUCHSTONE. Once the model achieves the electrical characteristics of a desired feedthrough, the actual feedthrough can be fabricated. In the instant case, the entire low-pass filter is created using conventional procedures for manufacturing IC packages, with the entire low-pass filter incorporated into the package itself. In this manner, discrete electrical components need not clutter the package, nor is it necessary to include such compensation in the IC itself.

The thick-film package is preferably manufactured using two layers of 94–96 percent alumina ceramic tape, metallized in the green state with refractory-grade tungsten, laminated, and high-temperature-cofired to produce a monolithic body. The lead frame and ground plane base are attached to the ceramic body by using high-temperature braze material. The ground plane base material is preferably Cu-W, but may also be Kovar, $Al_2O_3$, BeO, or AlN, for example. The package is then finished with nickel and gold plating suitable for wire-bonding and die-attach processes. Lidding is accomplished using a gold-plated Kovar lid and a eutectic Au-Sn preform.

A thin-film version of the package described above would employ essentially the same physical outline. The ceramic body in the thin-film version, however, is manufactured from high-grade ceramic layers attached using a glass frit having a lower melting point than that normally used.

The thickness of the main walls of the package are thinner than in the cofired version (approximately 15 mil, as opposed to 25 mil), and the lines beneath these walls are defined at 5-mil width (compared with 6-mil width in the cofired package). In all other respects, the thin-film package is structurally quite similar to the thick-film version, as is its performance.

Manufacture of the thin-film package differs slightly, however. Beginning with a large ceramic, the feedthroughs are printed, and the ceramic fired at comparatively low temperatures. The vias are then formed using a laser, and the die cavities cut, on a batch basis. Finally, conductors and vias are metallized and the ceramic cut into individual packages (assuming a batch process). After brazing the ground plane bases to the individual packages, leads may be welded on instead of brazed, which reduces the width of the lead-conductor attachment area.

Various modifications of the invention discussed in the foregoing description will become apparent to those skilled in the art. All such variations that basically rely on teachings through which the invention has advanced the art are properly considered within the spirit and scope of the invention.

I claim:

1. A compensated feedthrough for a monolithic microwave integrated circuit package, comprising:
   a first microstrip transmission line section including a first microstrip signal conductor;
   a pseudostrip transmission line section electrically connected to said first microstrip transmission line section, including a pseudostrip signal conductor electrically connected to said first microstrip signal conductor, wherein at least a portion of the length of said pseudostrip signal conductor is no greater than 6 mil in width; and
   a second microstrip transmission line section electrically connected to said pseudostrip transmission line section, including a second microstrip signal conductor electrically connected to said pseudostrip signal conductor, said second microstrip signal conductor having first and second ends, wherein said first end is electrically connected to said pseudostrip conductor and said second end is arranged to form two open-circuited studs.

2. A monolithic microwave integrated circuit package, comprising:
   a die cavity;
   a transition portion substantially surrounding the die cavity in two dimensions, said transition portion including a lid sealing ring and a ground plane base separated by a dielectric material, said dielectric material including at least one aperture formed in the dielectric material to enable electric connection of the sealing ring to the ground plane base, wherein said aperture is filled with electrically conductive material to substantially reference the lid sealing ring electrically to the ground plane base.

3. A monolithic microwave integrated circuit package as claimed in claim 2, wherein said transition portion includes at least one compensated feedthrough, said compensated feedthrough comprising:
   a first microstrip transmission line section including a first microstrip signal conductor;
   a pseudostrip transmission line section electrically connected to said first microstrip transmission line section, including a pseudostrip signal conductor electrically connected to said first microstrip signal conductor, wherein at least a portion of said pseudostrip signal conductor is no greater than 6 mil in width; and
   a second microstrip transmission line section electrically connected to said pseudostrip transmission line section, including a second microstrip signal conductor having first and second ends, wherein said first end is electrically connected to said pseudostrip signal conductor and said second end is arranged to form two open-circuited stubs at the interface between the second microstrip transmission line section and the die cavity.

4. A monolithic microwave integrated circuit package, comprising:
   a die cavity;
   a waveguide transition portion substantially surrounding the die cavity in two dimensions, wherein said waveguide transition portion includes at least one compensated feedthrough, said compensated feedthrough comprising:
   a first microstrip transmission line section including a first microstrip signal conductor;
   a pseudostrip transmission line section electrically connected to said first microstrip transmission line section, including a pseudostrip signal conductor electrically connected to said first microstrip signal conductor, wherein at least a portion of the length of said pseudostrip signal conductor is no greater than 6 mil in width; and
   a second microstrip transmission line section electrically connected to said pseudostrip transmission line section, including a second microstrip signal conductor having first and second ends, wherein said first end is electrically connected to said pseudostrip signal conductor and said second end is arranged to form two open-circuited stubs at the interface between the second microstrip transmission line section and the die cavity.

5. A method for designing a compensated feedthrough for an integrated circuit package, comprising the steps of:
   (a) establishing a desired equivalent electric circuit representing the electrical characteristics for a desired feedthrough;
   (b) designing physical characteristics for the desired feedthrough based upon the desired equivalent electrical circuit;
   (c) building the desired feedthrough having said physical characteristics;
   (d) testing the desired feedthrough; and
   (e) adjusting the feedthrough by comparing the characteristics obtained by testing of the desired feedthrough with the characteristics of the desired equivalent electrical circuit.

6. A method for designing a compensated feedthrough for an integrated circuit package as claimed in claim 5, further comprising, before step (a) the step of:
   (a) establishing a temporary equivalent electrical circuit representing the electrical characteristics of an existing feedthrough,
   wherein said desired electrical circuit is established by adjusting the temporary electrical circuit to achieve the desired electrical characteristics.

* * * * *